(12) United States Patent
Talwalkar et al.

(10) Patent No.: US 7,412,006 B2
(45) Date of Patent: Aug. 12, 2008

(54) METHOD AND APPARATUS FOR RF CARRIER FEEDTHROUGH SUPPRESSION

(75) Inventors: Sumit Talwalkar, Plantation, FL (US); Mahibur Rahman, Lake Worth, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 758 days.

(21) Appl. No.: 10/625,957

(22) Filed: Jul. 24, 2003

(65) Prior Publication Data

US 2005/0018788 A1    Jan. 27, 2005

(51) Int. Cl.
  *H04L 27/10*  (2006.01)
  *H04L 27/20*  (2006.01)
  *H03F 1/26*  (2006.01)

(52) U.S. Cl. .................. 375/284; 375/281; 375/296; 375/308; 330/149

(58) Field of Classification Search .............. 375/270, 375/279, 281, 284, 285, 296, 297, 301, 308; 330/149; 455/83, 570, 109, 126, 114.3
See application file for complete search history.

(56) References Cited

U.S. PATENT DOCUMENTS

| | | | | |
|---|---|---|---|---|
| 5,584,059 A | | 12/1996 | Turney et al. ............... 455/126 |
| 5,771,263 A | * | 6/1998 | Kanazawa et al. .......... 375/261 |
| 5,959,500 A | * | 9/1999 | Garrido ...................... 330/151 |
| 6,222,878 B1 | * | 4/2001 | McCallister et al. ........ 375/225 |
| 6,801,581 B1 | * | 10/2004 | Francos et al. .............. 375/296 |
| 6,940,916 B1 | * | 9/2005 | Warner et al. ............... 375/261 |
| 6,987,954 B2 | * | 1/2006 | Nielsen ................... 455/114.3 |
| 7,010,278 B2 | * | 3/2006 | Kirschenmann et al. . 455/114.2 |
| 2002/0048326 A1 | * | 4/2002 | Sahlman ..................... 375/297 |

* cited by examiner

Primary Examiner—Young T. Tse
(74) Attorney, Agent, or Firm—Fulbright & Jaworski, LLP

(57) ABSTRACT

A method includes performing a search method to determine a pair of receiver path correction signals, performing the search method to determine a pair of transmitter path correction signals, and using the pairs of receiver path and transmitter path correction signals to suppress a carrier signal. An apparatus includes a first pair of summers, an upconverter circuit coupled to the first pair of summers, a multiplexer coupled to the upconverter circuit, to a ground, and to an RF front end, a downconverter circuit coupled to the multiplexer, a second pair of summers coupled to the downconverter circuit, and a correction circuit coupled to the first and second pairs of summers.

3 Claims, 11 Drawing Sheets

METHOD AND APPARATUS FOR RF CARRIER FEEDTHROUGH SUPPRESSION

BACKGROUND OF THE INVENTION

1. Field of the Invention

The invention relates generally to the field of communications. More particularly, the invention relates to radio frequency (RF) communications.

2. Discussion of the Related Art

Quadrature modulation techniques enable two independent signals to be combined at a transmitter, transmitted on the same transmission band, and separated at a receiver. The principle of quadrature modulation is that two separate signals, I and Q (In-phase and Quadrature phase), are modulated by using the same carrier wave frequency, but the carrier wave of signal Q is 90° out of phase relative to the carrier wave of signal I. After modulation, the resulting signals are summed and transmitted. Because of the phase difference, the I and Q signals can be separated from each other when the summed signal is demodulated at the receiver.

In practical applications, quadrature modulator circuit elements in the baseband (I and Q) channels may present electrical mismatch and produce undesirable DC offsets. Since the baseband paths are DC coupled, all individual DC offset errors may add up and produce a combined effect in the form a carrier feedthrough at the modulator output, degrading the quality of the transmission.

Present attempts to solve these problems have used separate, dedicated RF detectors to improve transmission quality, but this has resulted in increased system cost and higher current drain.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore nonlimiting, embodiments illustrated in the drawings, wherein like reference numerals (if they occur in more than one view) designate the same or similar elements. The invention may be better understood by reference to one or more of these drawings in combination with the description presented herein It should be noted that the features illustrated in the drawings are not necessarily drawn to scale.

DETAILED DESCRIPTION

Figure 1:
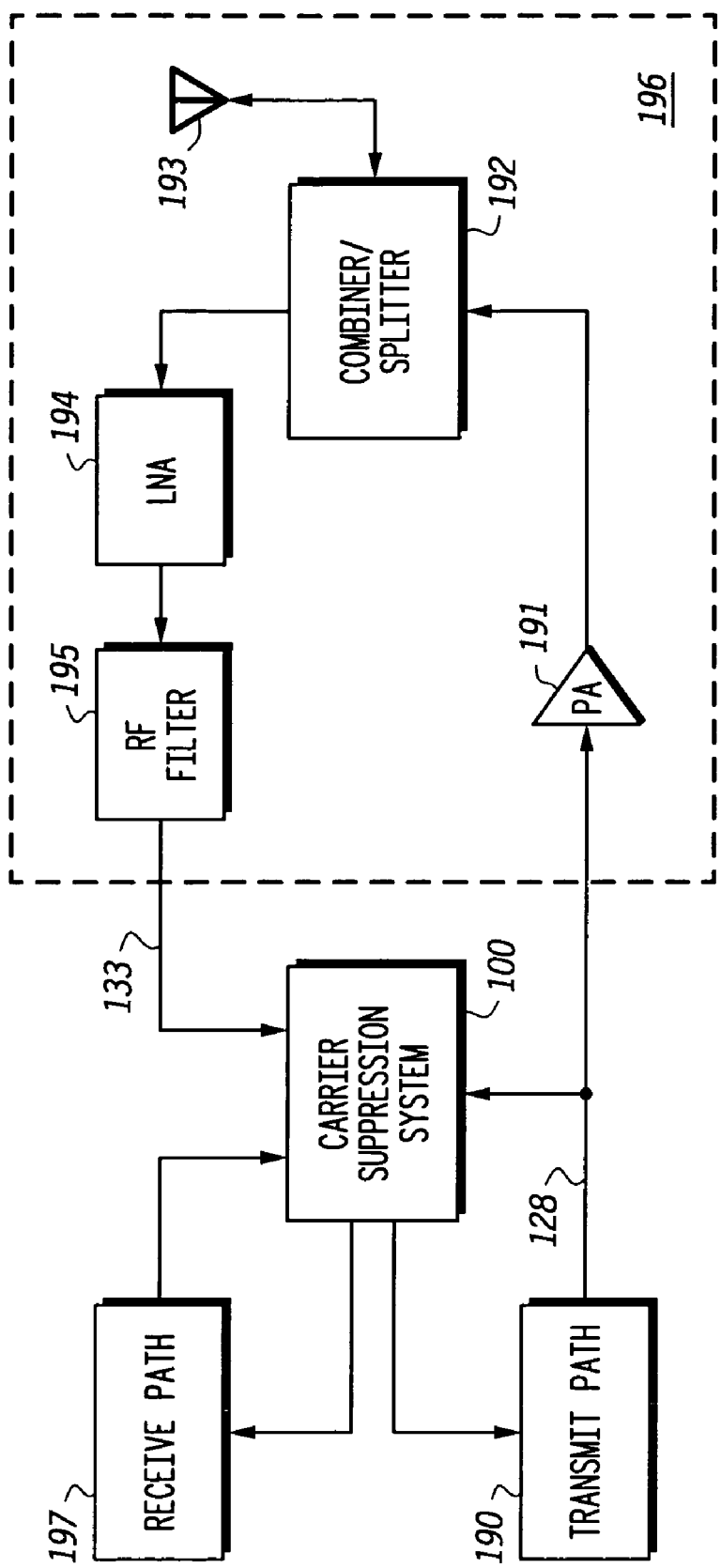
FIG. 1 is a block diagram of an RF transceiver with a carrier suppression system, representing an embodiment of the invention.

The invention and the various features and advantageous details thereof are explained more fully with reference to the nonlimiting embodiments that are illustrated in the accompanying drawings and detailed in the following description. It should be understood that the detailed description and the specific examples, while indicating specific embodiments of the invention, are given by way of illustration only and not by way of limitation. Various substitutions, modifications, additions and/or rearrangements within the spirit and/or scope of the underlying inventive concept will become apparent to those of ordinary skill in the art from this disclosure.

According to an aspect of the invention, a method for suppressing a carrier in a quadrature modulator includes performing a search method to determine a pair of receiver path correction signals, performing the search method to determine a pair of transmitter path correction signals, and using the pairs of receiver path and transmitter path correction signals to suppress a carrier signal in a quadrature modulator.

According to another aspect of the invention, another method for suppressing a carrier in a quadrature modulator includes performing a calibration method to determine a pair of receiver path correction signals, performing a search method to determine a pair of transmitter path correction signals, and using the pairs of receiver path and transmitter path correction signals to suppress a carrier signal in a quadrature modulator.

According to yet another aspect of the invention, an apparatus for suppressing a carrier in a quadrature modulator including a first pair of summers, an upconverter circuit coupled to the first pair of summers, each of the pair of summers being coupled to a quadrature channel, a multiplexer coupled to the upconverter circuit, to a ground, and to an RF front end, a downconverter circuit coupled to the multiplexer, a second pair of summers coupled to the downconverter circuit, each of the pair of summers being coupled to a quadrature channel, and a correction circuit coupled to the first and second pairs of summers, the correction circuit performing a first correction method to determine a pair of receiver path correction signals, performing a second correction method to determine a pair of transmitter path correction signals, and using the pairs of receiver path and transmitter path correction signals to suppress a carrier signal in a quadrature modulator.

The invention may include a method and apparatus for suppressing a carrier in a quadrature modulator, in a multimodulator, or the like. In one embodiment, the invention may include a carrier suppression method and apparatus that uses a two-dimensional binary search method to generate I and Q channel corrections to compensate for a DC offset (imbalance) in a transmitter path and in a receiver path. In another embodiment, the invention may include using the two-dimensional binary search method to correct the DC offset in the transmitter path, and using a feedback DC offset calibration method to correct for the DC offset in the receiver path. The carrier suppression method and apparatus of the present invention may operate in the presence of gain imbalances and/or phase errors.

Thus, the present invention provides a method or apparatus for suppressing carrier feed-through in a multi-modulator platform by digitally correcting independent I and Q channel DC offsets at baseband using Cartesian feedback and without the use of separate, dedicated high cost and high current drain RF detectors.

Referring to FIG. 1, a block diagram of an RF transceiver with a carrier suppression system is depicted according to an exemplary embodiment of the invention. A transmit path 190 provides an upconverted signal 128 to a carrier suppression system 100 and to a power amplifier 191 of an RF front-end 196. The transmit path 190 may include, for example, a modulator circuit and an upconverter circuit. The power amplifier 191 is coupled to a combiner/splitter 192, and the combiner/splitter is coupled to an antenna 193 and to a low-noise amplifier 194. The low noise amplifier 194 is coupled to an RF filter 195, and the RF filter 195 provides the carrier suppression system 100 with a detector signal 133. The carrier suppression system 100 is coupled to a receive path 197. The receive path 197 may include, for example, a downconverter and a demodulator.

In one embodiment, the carrier suppression system 100 may include, for example, a correction circuit, a multiplexer, a control circuit, and/or a program storage device. In another embodiment, the correction circuit of the carrier suppression system 100 may include, for example, a binary search circuit and/or a feedback DC calibration circuit. In operation, the carrier suppression system 100 provides both the receiver 197 and transmitter 190 with correction signals in order to correct a DC imbalance.

Figure 2:
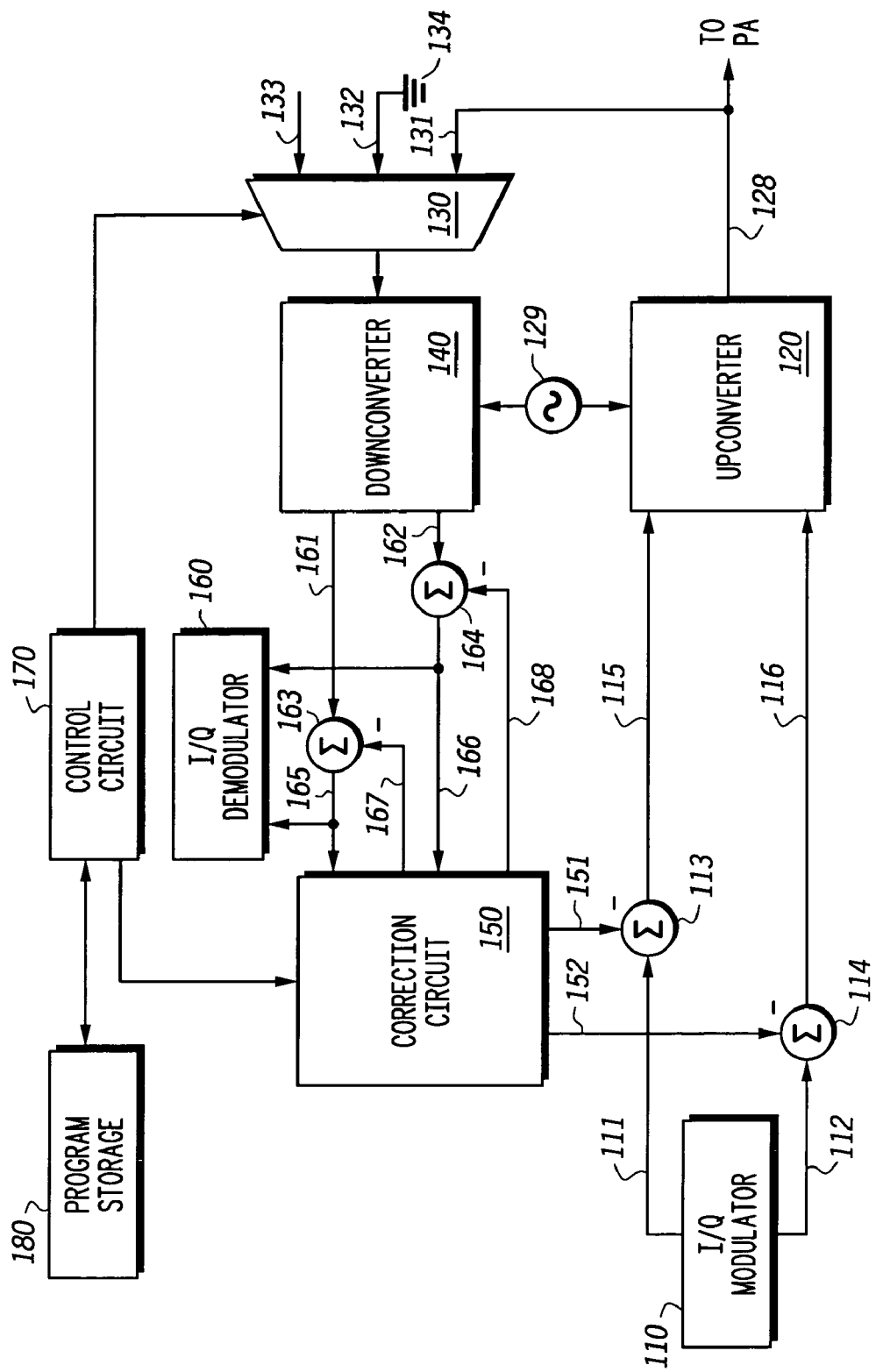
FIG. 2 is a block diagram of a carrier suppression system, representing an embodiment of the invention.

FIG. 2, presents a more detailed a block diagram of a carrier suppression system usable with an RF transceiver such as the one detailed in FIG. 1. An I/Q modulator 110 produces an in-phase signal (I) 111 and a quadrature-phase signal (Q) 112. The in-phase signal 111 is coupled to the positive input of a first summer 113 and the quadrature-phase signal 112 is coupled to the positive input of a second summer 114. An in-phase correction signal 151 is produced by a correction circuit 150 and is coupled to the negative input of the first summer 113. A quadrature-phase correction signal 152 is produced by the correction circuit 150 and is coupled to the negative input of the second summer 114. The first and second summers 113, 114 output corrected in-phase and quadrature phase signals 115, 116 into an upconverter circuit 120. The upconverter circuit 120 outputs an upconverted signal 128 to a power amplifier (not shown) and to a first input 131 of a multiplexer 130. A second input 132 of the multiplexer 130 is coupled to the ground 134, and a third input 133 of the multiplexer 130 is coupled to an RF front end (not shown). The RF front end may include, for example, an antenna, an RF detector, and/or an amplifier circuit, all of which are well known in the art. A local oscillator 129 is coupled to the upconverter circuit 120 and to a downconverter circuit 140.

The output of the multiplexer 130 is coupled to the downconverter circuit 140. The downconverter circuit 140 produces a downconverted in-phase signal 161 and a downconverted quadrature-phase signal 162. The downconverted in-phase signal 161 is coupled to the positive input of a third summer 163, and the downconverted quadrature-phase signal 162 is coupled to the positive input of a fourth summer 164. An in-phase DC offset correction signal 167 is produced by the correction circuit 150 and is coupled to the negative input of the third summer 163. A quadrature-phase DC offset correction signal 168 is produced by the correction circuit 150 and is coupled to the negative input of the fourth summer 164. The third summer 163 outputs an in-phase DC offset corrected signal 165 to the correction circuit 150 and to an I/Q demodulator circuit 160. The fourth summer 164 outputs a quadrature phase DC offset corrected signal 166 to the correction circuit 150 and to the I/Q demodulator circuit 160. A control circuit 170 is coupled to the correction circuit 150, to a program storage device 180, and to the multiplexer 130.

In operation, the control circuit 170 switches the multiplexer 130 to a position corresponding to a particular mode of operation, reads an instruction stored in the program storage device 180, and controls the correction circuit 150 for performing a DC offset correction and/or a carrier suppression method. In one exemplary embodiment, the carrier suppression system may operate in at least three modes determined by the control circuit 170.

In a first mode of operation, the multiplexer 130 is coupled to its second input 132, and the correction circuit 150 may determine and correct an I/Q channel imbalance in the receive path. Thus the first mode corrects I/Q imbalance in the receive path of the transmitter. In a second mode of operation, the multiplexer 130 is coupled to its first input 131, and the correction circuit 150 may determine and correct an I/Q channel imbalance in the transmit path. Thus the second mode corrects I/Q imbalance in the transmit path of the transmitter. In a third mode of operation, the multiplexer 130 is coupled to its third input 133 (RF front end), a full-duplex transmit/receive (normal) operation may be enabled. Thus, the third mode is normal operation. It should be noted that the RF detectors in the transmitter are used during the correction process, thus eliminating the need for additional RF detectors for imbalance correction, thus resulting-in lower cost and power consumption.

Figure 3:
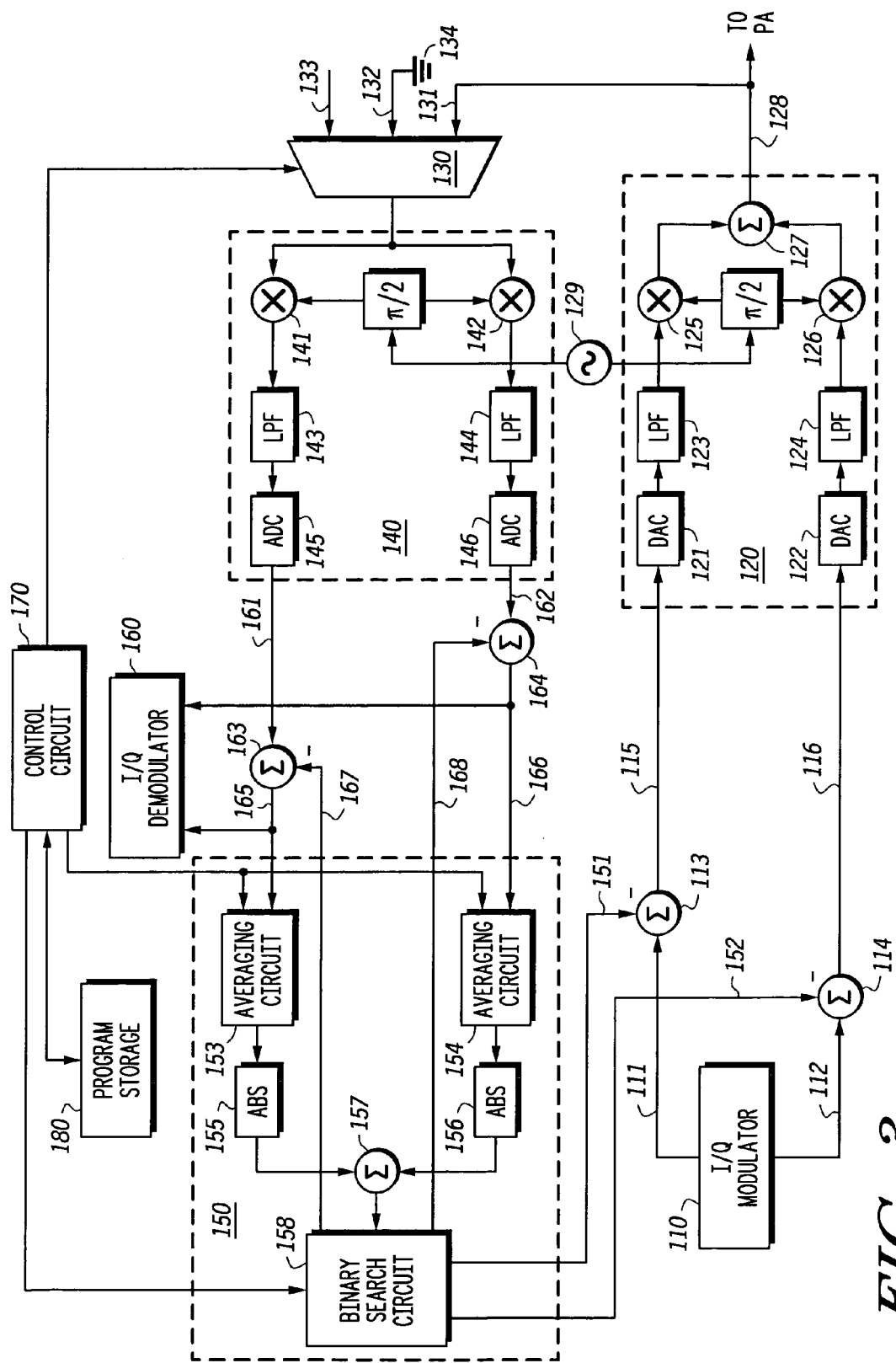
FIG. 3 is a detailed block diagram of the carrier suppression system, representing another embodiment of the invention.

During the first mode of operation, an I/Q channel offset in the receive path may be determined and corrected using a binary search circuit 158 (as detailed in FIG. 3). Alternatively, the I/Q channel offset may be determined and corrected using a feedback DC calibration circuit 159 (as detailed in FIG. 4). During the second mode of operation, an I/Q channel offset in the transmit path may also be determined and corrected using the binary search circuit 15X. A binary search method which may be performed by the binary search circuit 158 is described in FIGS. 6-11.

In practice, the carrier suppression system may be implemented as an integrated circuit (IC). The correction circuit 150 may be a programmable circuit, such as, for example, a microprocessor or digital signal processor-based circuit, that operates in accordance with instructions received by the control circuit 170 and stored in the program storage media 180. The program storage media 180 may be any type of readable memory including, for example, a magnetic or optical media such as a card, tape or disk, or a semiconductor memory such as a PROM or FLASH memory. The correction circuit 150 may be implemented in software, or the functions may be implemented by a hardware circuit, or by a combination of hardware and software.

When the correction circuit 150 is a programmable circuit, a program, such as that presented below and discussed in detail with reference to FIGS. 5-11, is stored in the program storage media 180 to create an apparatus in accordance with the present invention that operates in accordance with the methods of the present invention. In the alternative, the correction circuit 150 may be hard-wired or may use predetermined data tables, or may be a combination of hard-wired and programmable circuitry.

In one embodiment, the invention may include a multi-modulator structure. Multi-modulators are used to efficiently support different modulation protocols due to the trade-offs among noise figures, inter-modulation requirements, and current drain among the various modulation paths. The invention may include a method and/or apparatus for suppressing a carrier in a multi-modulator system.

Referring to FIG. 3, a detailed block diagram of the carrier suppression system of FIG. 2 is depicted according to one exemplary embodiment of the invention. The outputs of summers 113, 114 are coupled to a pair of digital-to-analog converters 121, 122 in the upconverter 120, and the digital-to-analog converters 121, 122 are coupled to a pair of low-pass filters 123, 124, respectively. The outputs of the low-pass filters 123, 124 are mixed with two local oscillator 129 signals (each 90° out of phase with respect to each other) at a pair of mixers 125, 126, respectively, and the outputs of mixers 125, 126 are summed at summer 127. The output 128 of summer 127 is coupled to the power amplifier (not shown) and to the first input 131 of the multiplexer 130.

The output of the multiplexer 130 is coupled to another pair of mixers 141, 142 in the downconverter 140, where it is mixed with two local oscillator 129 signals (each 90° out of phase with respect to each other). The outputs of the mixers 141, 142 are coupled to another pair of low-pass filters 143, 144, and the outputs of the low-pass filters 143, 144, are coupled to a pair of analog-to-digital converters 145, 146, respectively. The outputs of the analog-to-digital converters 145, 146 are coupled to summers 163, 164. The outputs of summers 163, 164 are coupled to a pair of averaging circuits 153, 154 in the correction circuit 150. The averaging circuits 153, 154 are coupled to a pair of absolute value circuits 155, 156, and the absolute value circuits are summed at summer 157. The output of summer 157 is coupled to a binary search circuit 158. The binary search circuit 158 is coupled to the control circuit 170, and may produce and apply correction signals 151, 152, 167, and 168 to the negative inputs of summers 113, 114, 163, and 164, respectively.

During the first mode of operation, the control circuit 170 switches the multiplexer 130 to ground 134 and an I/Q channel offset in the receive path may be determined and corrected using the binary search circuit 158. During the second mode of operation, the control circuit 170 switches the multiplexer 130 to its first input 131 an I/Q channel offset in the transmit path is also determined and corrected using the binary search circuit 158. The averaging circuits 153, 154 may perform averages of values output from the summers 163, 164.

When the averaging circuits 153, 154 and the binary search circuit 158 are programmable, the control circuit 170 may provide them with instructions stored in the program storage device 180. For example, the control circuit 170 may provide the averaging circuits 153, 154 with a number of averages to be taken. In the alternative, averaging circuits 153, 154 and the binary search circuit 158 may be hard-wired or may use predetermined data tables, or may be a combination of hard-wired and programmable circuitry.

Figure 4:
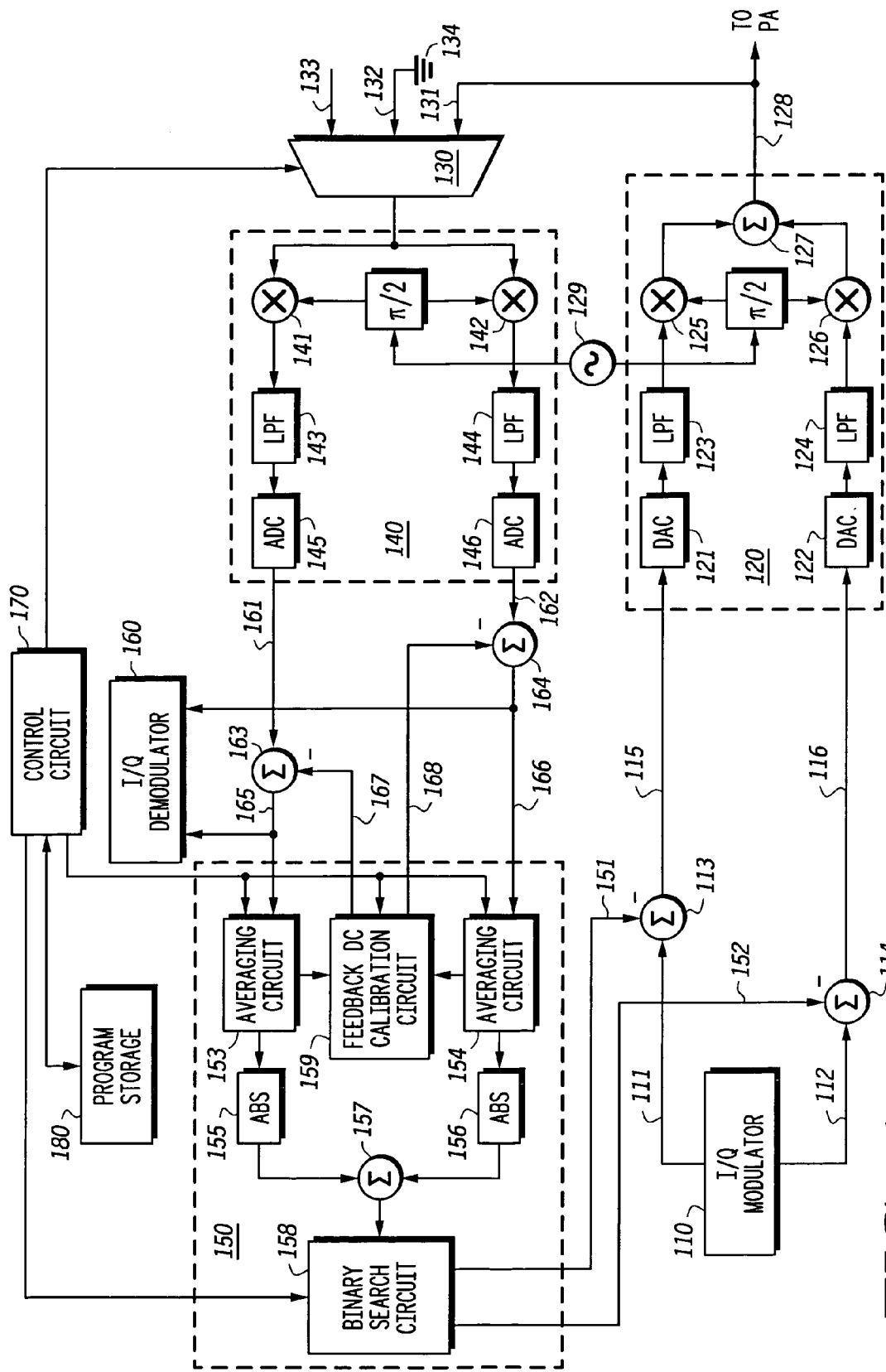
FIG. 4 is another detailed block diagram of the carrier suppression system, representing an embodiment of the invention.

Referring to FIG. 4, another detailed block diagram of the carrier suppression system of FIG. 2 is depicted according to an exemplary embodiment of the invention. In this alternative embodiment, a feedback DC calibration circuit 159 is coupled to the averaging circuits 153, 154, to the control circuit 170, and to summers 163, 164.

In the first mode of operation, the control circuit 170 may provide the feedback DC calibration circuit 159 with instructions and/or information, such as, for example, the current mode of operation. The control circuit 170 may also provide the averaging circuits 153, 154 with information, such as, for example, a number of averages to be taken. In operation, when multiplexer 130 switches its input to ground, the feedback DC calibration circuit 159 may store values, corresponding to the in-phase and quadrature phase DC offset voltages, output from the averaging circuits 153, 154, and apply these as in-phase and quadrature phase DC offset correction signals 167, 168 to the negative input of summers 163, 164. As a result, an I/Q imbalance is corrected in the receive path. In the second mode of operation, an I/Q channel offset in the transmit path is determined and corrected using the binary search circuit 158.

When the averaging circuits 153, 154, the feedback DC calibration circuit 159, and the binary search circuit 158 are programmable, the control circuit 170 may provide them with instructions stored in the program storage device 180. In the alternative, averaging circuits 153, 154, the feedback DC calibration circuit 159 and the binary search circuit 158 may be hard-wired or may use predetermined data tables, or may be a combination of hard-wired and programmable circuitry.

Figure 5:
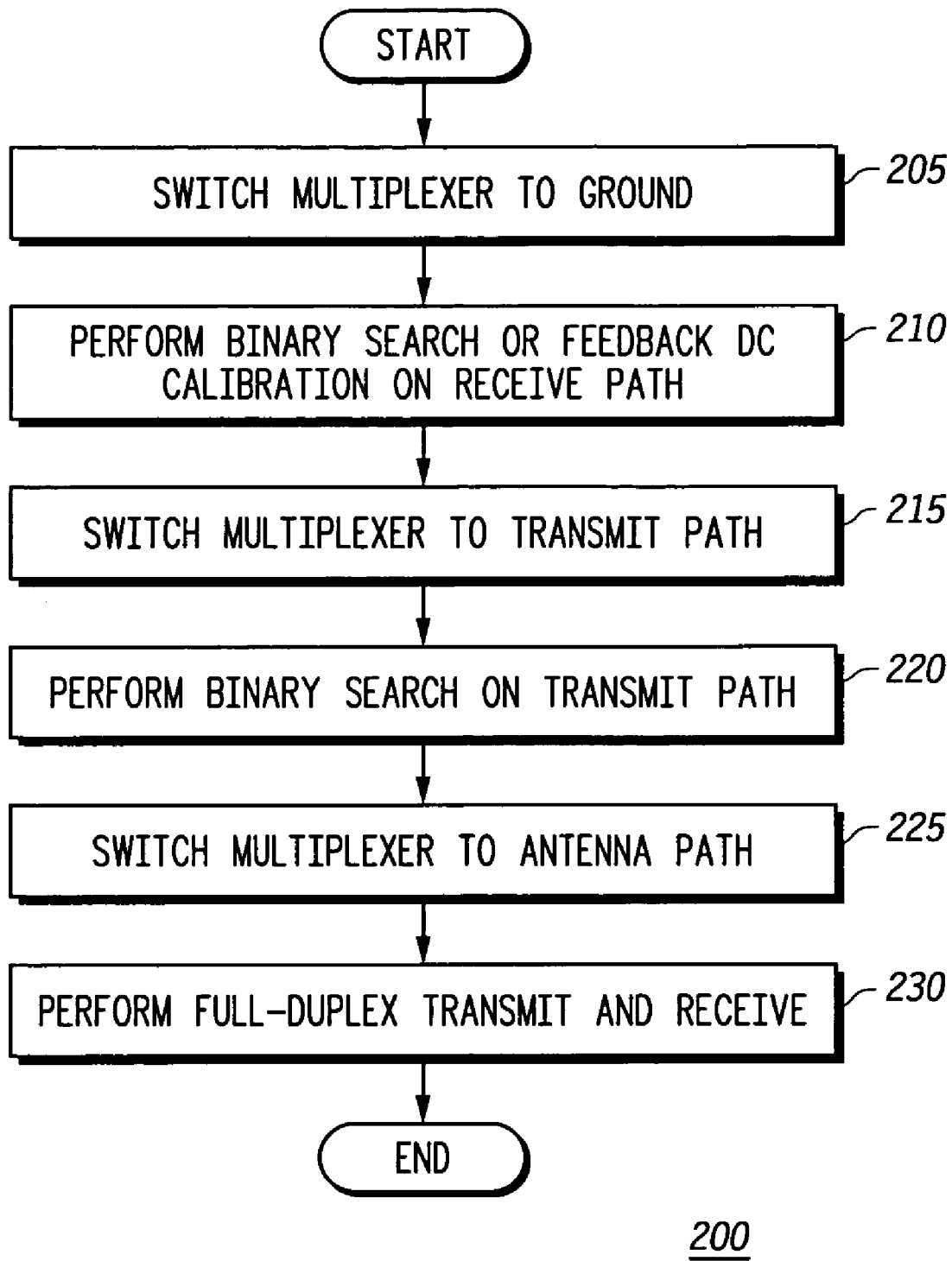
FIG. 5 is a flowchart of a feedback DC calibration method, representing an embodiment of the invention.

Referring to FIG. 5, a flowchart of a cartesian feedback carrier suppression method 200 is depicted according to one exemplary embodiment of the invention. The method 200 may be used to suppress a carrier in the circuit detailed in FIGS. 1-4. Steps 205, 210 define the first mode of operation, steps 215, 220 define the second mode of operation, and steps 225, 230 define the third mode of operation. In step 205, the multiplexer 130 is switched to ground 131. In step 210, a binary search or a feedback DC offset calibration method is performed in order to correct an I/Q offset on the receive path (that is, for the embodiment detailed in FIG. 3, the binary search method is performed, while for the embodiment detailed in FIG. 4, the feedback DC offset calibration method is performed). In step 215, the multiplexer 130 is switched to the transmitter path 128, and in step 220, another binary search method is performed (while correction signals 167, 168 are applied) in order to correct an I/Q offset on the transmit path. In step 225, the multiplexer 130 is switched to the antenna path 132, and in step 230, a full-duplex operation is enabled (while all correction signals 151, 152, 167, 168 are applied).

In one exemplary embodiment, the binary search of steps 210 and/or 220 in the cartesian feedback carrier suppression method 200 may comprise an unrotated binary search method, a rotated binary search method and/or a hybrid binary search method, depicted in FIGS. 6-7, 8-9, and 10-11, respectively. For simplicity, the binary search methods described below are illustrated with regard to the second mode of operation (correction of an I/Q imbalance on the transmit path). However, one of ordinary skill in the art will recognize in light of this disclosure that the same binary search methods may be used during the first mode of operation (correction of an I/Q imbalance on the receive path), for the embodiment detailed in FIG. 3.

Figure 6:
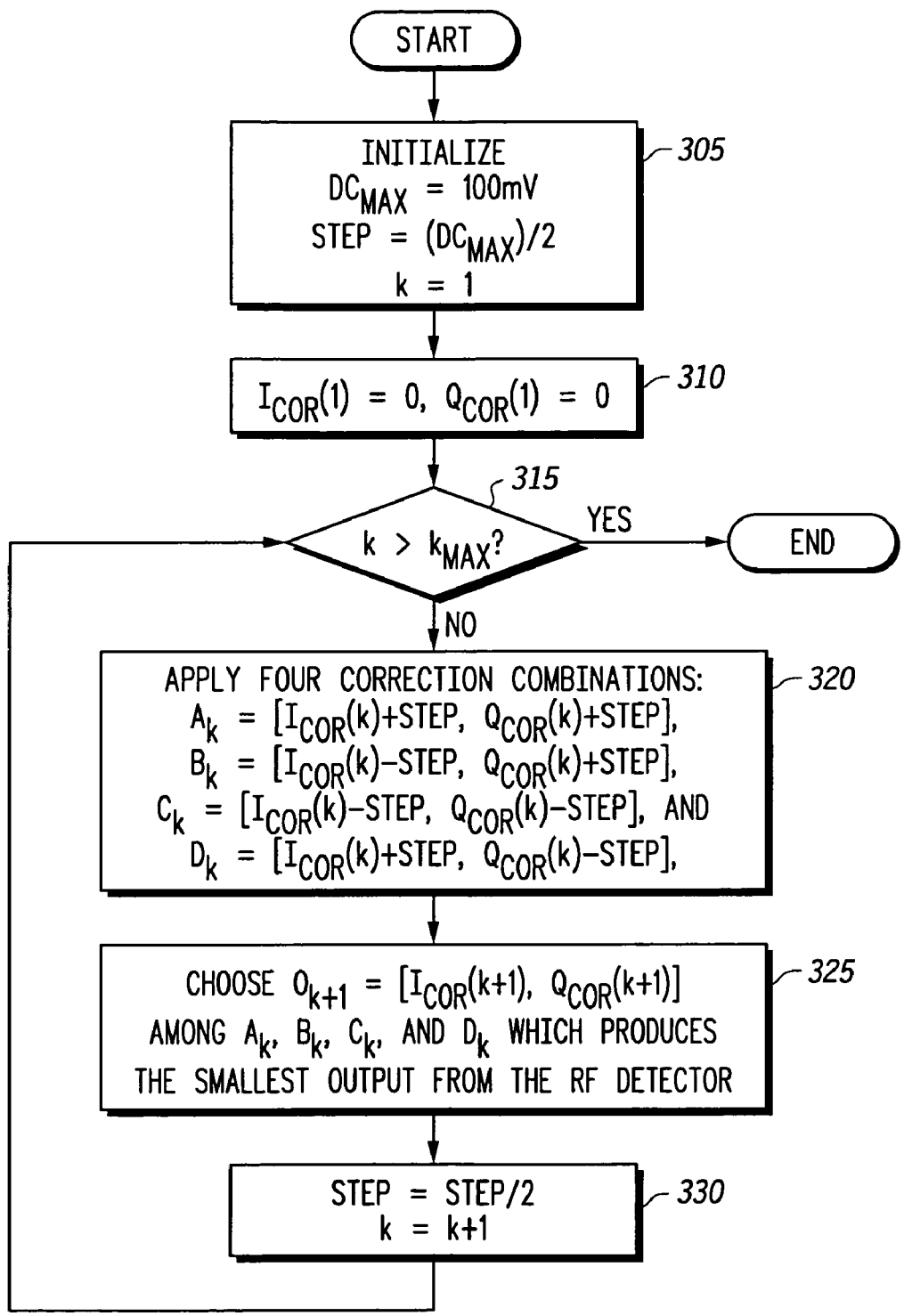
FIG. 6 is a flowchart of an unrotated carrier suppression method, representing an embodiment of the invention.
Figure 7:
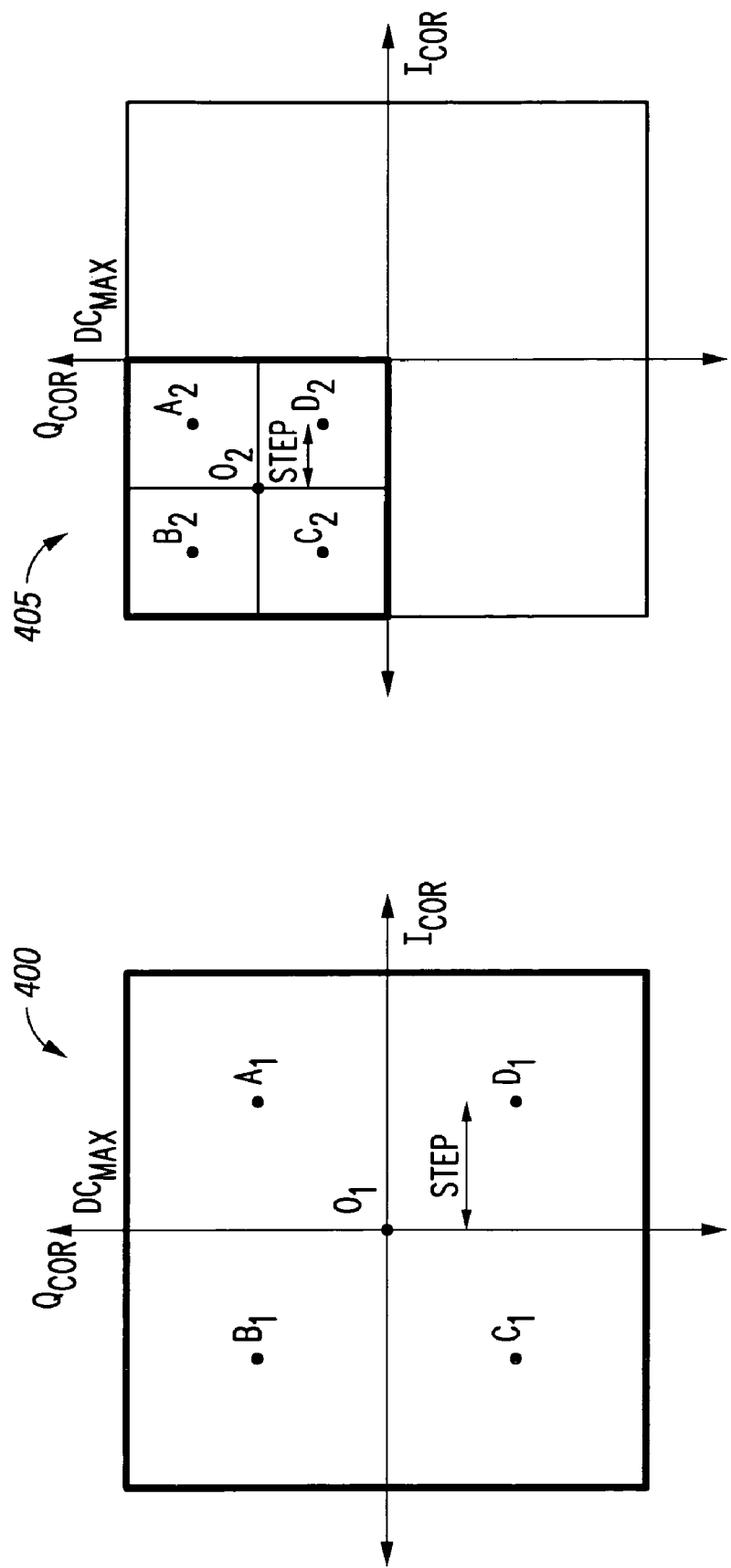
FIG. 7 is a diagram of an unrotated carrier suppression iteration, illustrating an embodiment of the invention.

Referring to FIG. 6, a flowchart of an unrotated binary search method 300 is depicted according to one exemplary embodiment of the invention. The unrotated binary search method 300 may include a 2-dimensional binary search algorithm, and may be performed by the binary search block 158 of the correction circuit 150 detailed in FIGS. 1-4. FIG. 7 is a diagram of an unrotated binary search iteration is depicted illustrating an aspect of the invention detailed in FIG. 6. The horizontal axis is the in-phase correction signal 151 ($I_{COR}$), and the vertical axis is quadrature-phase correction signal 152 ($Q_{COR}$).

Referring to FIGS. 6 and 7, the unrotated method 300 may determine a search area and apply correction signals $I_{COR}$ 151 and $Q_{COR}$ 152 to summers 113, 114 while monitoring the output of summer 157. Next, the unrotated method 300 may modify the search area in order to minimize the output of summer 157 and repeat a searching process for a predetermined number of times from k=1 to k=$k_{MAX}$, where k is an index or a counting variable and $k_{MAX}$ is the total number of iterations. In one embodiment, the amplitude of a maximum DC error ($DC_{MAX}$) may determine the initial search area 400, which may be a square of side equal to $2DC_{MAX}$ centered at an origin $O_k$. The initial search area 400 may be divided into four quadrants, and four correction signal pairs may each correspond to the X and Y coordinates of the center of a search area quadrant.

In an initialization step 305, a step variable is defined as a function of $DC_{MAX}$, and k is set to 1. In one embodiment, $DC_{MAX}$ equals approximately 100 mV, and the step variable value is set to $$\frac{DC_{MAX}}{2}.$$

In step 310, $I_{COR}$ 151 and $Q_{COR}$ 152 are set to zero, that is, $I_{COR}(k=1)=Q_{COR}(k=1)=0$, and control passes to step 315. If k is greater than a predetermined value (k>$k_{MAX}$), the method ends. Otherwise, control passes to step 320. In one embodiment, $k_{MAX}=10$, although other values would also be acceptable.

In step 320, four correction signal combination pairs ($A_k$, $B_k$, $C_k$ and $D_k$) are sequentially applied to the I and Q channels as $I_{COR}$ 151 and $Q_{COR}$ 152 signals, and four outputs are detected. Each correction signal pair has X and Y coordinates in the form [X, Y]. The X coordinate value is applied to the I channel via $I_{COR}$ 151 and the Y coordinate value is applied to the Q channel via $Q_{COR}$ 152 simultaneously. In one embodiment, the correction signal pairs may be expressed by:

$A_k=[I_{COR}(k)+\text{step}, Q_{COR}(k)+\text{step}];$ $B_k=[I_{COR}(k)-\text{step}, Q_{COR}(k)+\text{step}];$ $C_k=[I_{COR}(k)-\text{step}, Q_{COR}(k)-\text{step}];$ and $D_k=[I_{COR}(k)+\text{step}, Q_{COR}(k)-\text{step}].$ In step 325, a new search area 405 is chosen. The new search area 405 is centered at the X and Y coordinates of the correction signal pair which yielded the smallest detected RF output. For example, if the combination pair corresponding to $B_1$ resulted in the smallest output, then, for the next iteration, the new search area 405 is centered at $O_2=B_1=[I_{COR}(1)-\text{step}, Q_{COR}(1)+\text{step}]$. Next, in step 330, the step variable is divided by two $$(\text{step}=\frac{DC_{MAX}}{4})$$

and k is incremented by one and control returns to step 315.

The unrotated method 300 may search for the best quadrant of the search area at every iteration, providing a fast convergence by reducing the search area by a factor of 4 at every iteration. Thus, each iteration may add a binary digit of precision to each of the correction values $I_{COR}$ 151, $Q_{COR}$ 152. After the last iteration of the unrotated method 300, the X and Y coordinate values corresponding to the correction signal pair that yields the smallest output at summer 157 are selected as the optimum $I_{COR}$ 151 and $Q_{COR}$ 152 signals, respectively.

Figure 8:
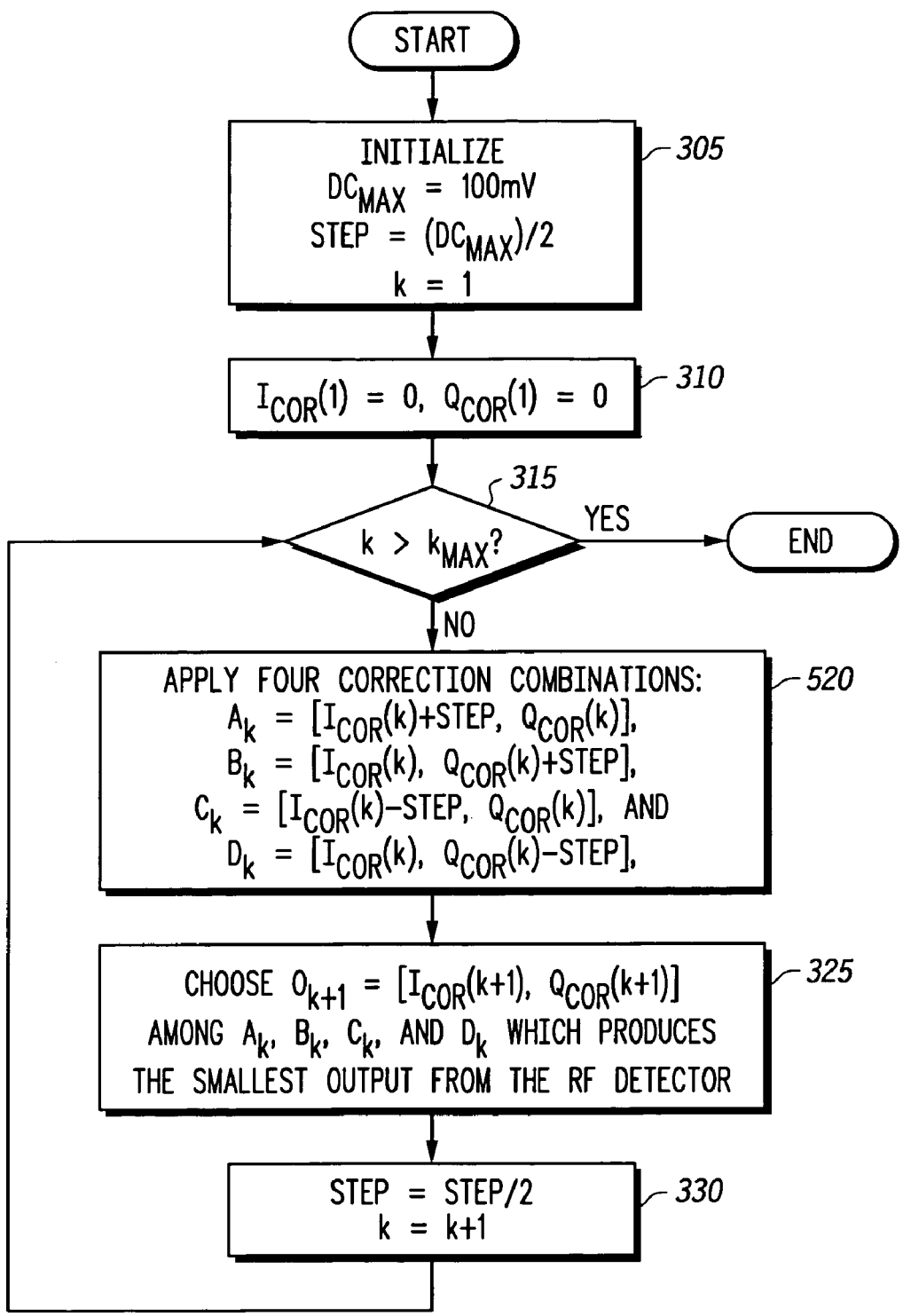
FIG. 8 is a flowchart of a rotated carrier suppression method, representing an embodiment of the invention.
Figure 9:
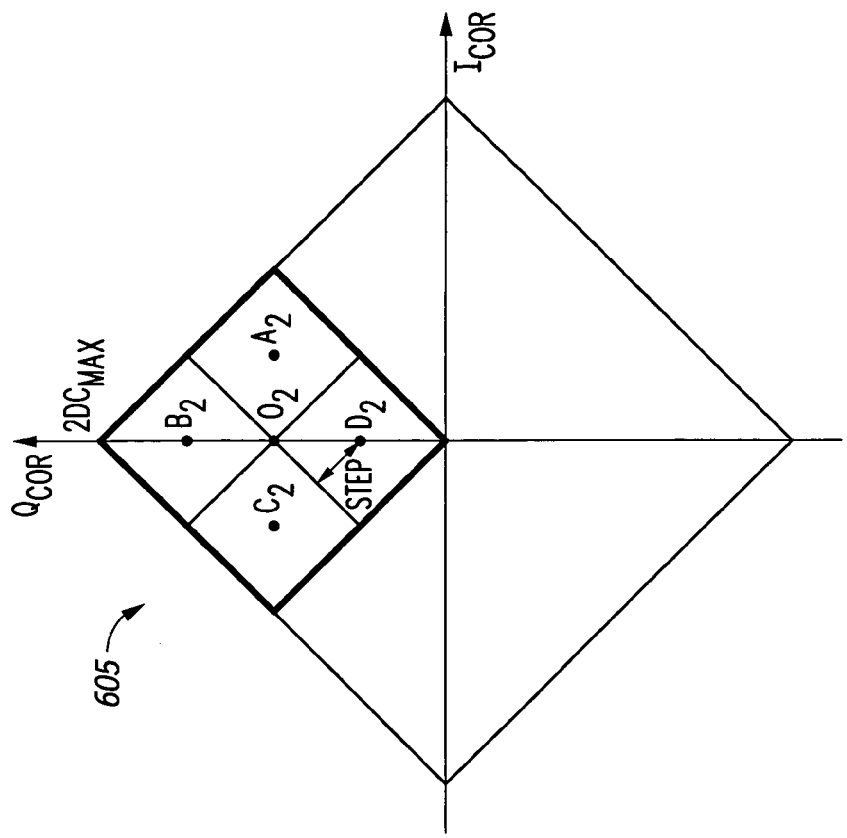
FIG. 9 is a diagram of a rotated carrier suppression iteration, illustrating an embodiment of the invention.
Figure 9:
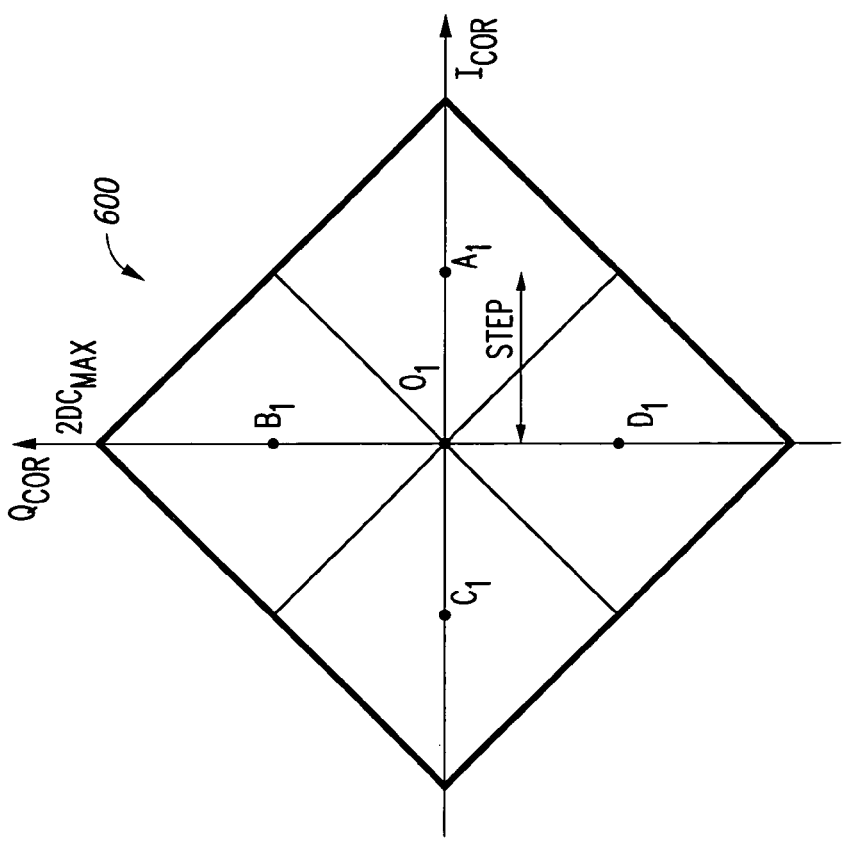

Referring to FIG. 8, a flowchart of a rotated binary search method 500 is depicted according to one exemplary embodiment of the invention. The rotated binary search method 500 may include a 2-dimensional binary search algorithm, and may be performed by the binary search block 158 of the correction circuit 150 detailed in FIGS. 1-4. FIG. 9 is a diagram of a rotated binary search iteration is depicted illustrating an aspect of the invention detailed in FIG. 8. The horizontal axis is the in-phase correction signal 151 ($I_{COR}$), and the vertical axis is quadrature-phase correction signal 152 ($Q_{COR}$).

Referring to FIGS. 8 and 9, the rotated method 500 may determine optimum $I_{COR}$ 151 and $Q_{COR}$ 152 signals in the presence of I-Q gain imbalance and/or a local oscillator's 129 phase error. In the presence of gain imbalance and/or phase error, RF carrier amplitude contour lines may change from circles to ellipses with their axes rotated by 45°.

The rotated method 500 is similar to the unrotated method 300 detailed in FIG. 6 with all steps except step 520 being identical. In step 520, the four correction signal combination pairs ($A_k$, $B_k$, $C_k$ and $D_k$), which are sequentially applied to the in-phase and quadrature phase channels, may be expressed by:

$A_k=[I_{COR}(k)+\text{step}, Q_{COR}(k)];$ $B_k=[I_{COR}(k), Q_{COR}(k)+\text{step}];$ $C_k=[I_{COR}(k)-\text{step}, Q_{COR}(k)];$ and $D_k=[I_{COR}(k), Q_{COR}(k)-\text{step}].$ The rotated method 500 may search for the best quadrant of an initial search area 600 and modify it into another area 605 reduced by a factor of 4 at every iteration. Thus, each iteration may add a binary digit of precision to each of the correction values $I_{COR}$ 151, $Q_{COR}$ 152. After the last iteration of the rotated method 500, the X and Y coordinate values corresponding to the correction signal pair that yields the smallest output at summer 157 are selected as the optimum $I_{COR}$ 151 and $Q_{COR}$ 152 signals, respectively.

In one embodiment, the invention may include using a hybrid search method as a combination of methods 300 and 500 detailed in FIGS. 6 and 8 for determining optimal values for $I_{COR}$ 151 and $Q_{COR}$ 152. For example, the unrotated search method 300 may be performed during the first $k_1$ iterations, where $k_1$ is a first counting variable, and the rotated search method 500 may be used for the remaining iterations.

Figure 10:
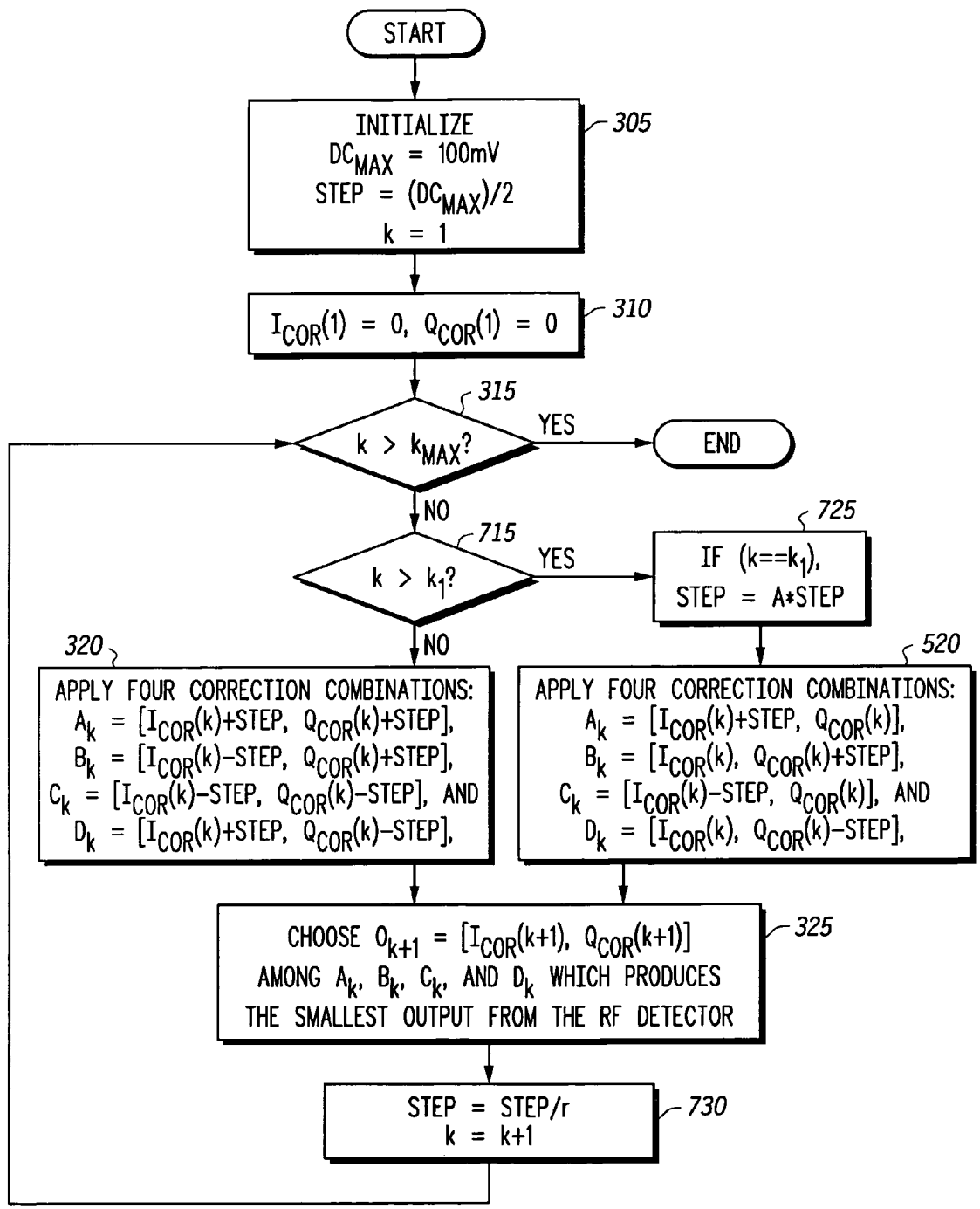
FIG. 10 is a flowchart of a hybrid carrier suppression method, representing an embodiment of the invention.
Figure 11:
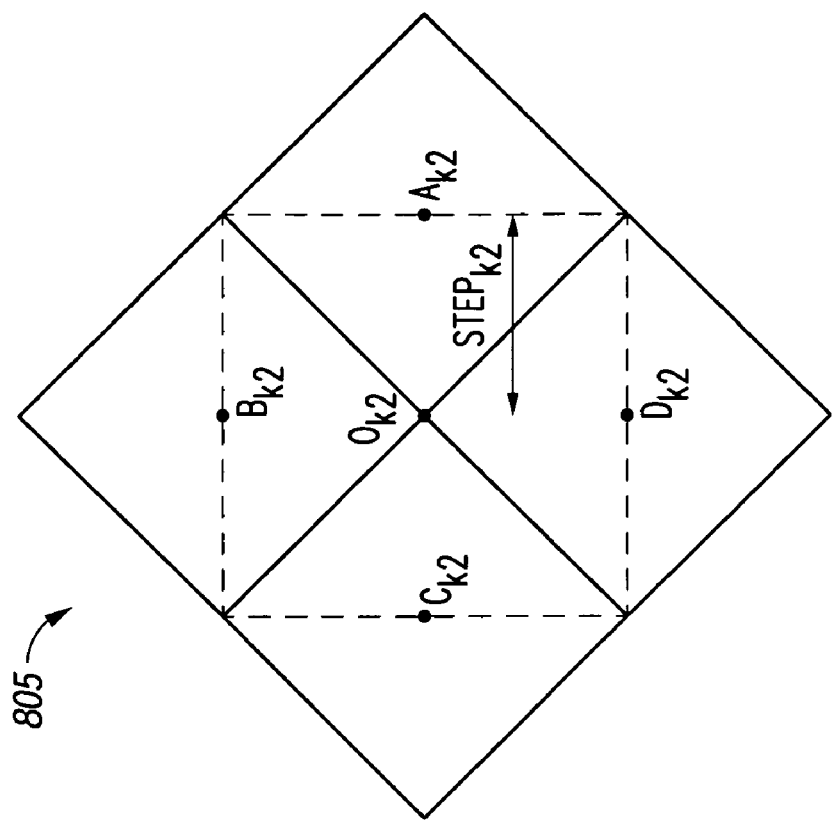
FIG. 11 is a diagram of a hybrid carrier suppression iteration, illustrating an embodiment of the invention.
Figure 11:
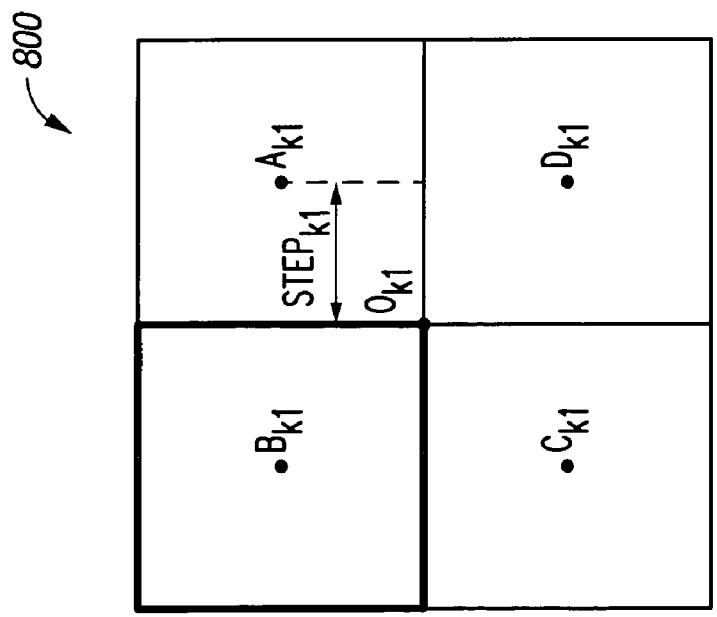

Referring to FIG. 10, a flowchart of a hybrid binary search method 700 is depicted according to one exemplary embodiment of the invention. The hybrid binary search method 700 may include a 2-dimensional binary search algorithm, and may be performed by the binary search block 158 of the correction circuit 150 detailed in FIGS. 1-4. FIG. 11 is a diagram of a hybrid binary search iteration is depicted illustrating an aspect of the invention detailed in FIG. 10. The horizontal axis is the in-phase correction signal 151 ($I_{COR}$), and the vertical axis is quadrature-phase correction signal 152 ($Q_{COR}$).

The hybrid method 700 is similar to the unrotated and rotated methods 300, 500 detailed in FIGS. 6 and 8, with all steps except steps 715, 725, and 730 being identical. In step 715, if the current iteration index (k) is less than or equal to a switching index ($k_1$), control passes to step 320 and the unrotated search method 300 is performed. Otherwise control passes to step 725 and the rotated search method 500 is performed until k>$k_{MAX}$. In step 725, the value of the step variable is multiplied by a value A if the first iteration of the rotated method is being performed, that is, $k=k_1$. In one embodiment, A is a number greater or equal to 2.

In this exemplary embodiment, the step variable is divided by a number r in step 730, where r is greater than 1 and lesser than or equal to 2. A variable step ratio (step/r) may be used to slower the search area reduction rate, thereby increasing accuracy. As one of ordinary skill in the art will recognize in light of this disclosure, there may be a trade-off between acquisition time and accuracy.

In the example of FIG. 11, $B_k$ (from step 320) is the last chosen unrotated quadrant of the search area 800. Thus, in the following iteration ($k_2=k_1+1$), a first rotated search area 805 is defined. In order for the rotated search area 805 to include the unrotated chosen quadrant of search area 800 the rotated search area 805 is increased by a factor of A at the beginning of the $(k_1+1)^{th}$ iteration. After the last iteration of the hybrid method 700, the X and Y coordinate values corresponding to the correction signal pair that yields the smallest output at summer 157 are selected as the optimum $I_{COR}$ 151 and $Q_{COR}$ 152 signals, respectively.

The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The term program or software, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

What is claimed is:

1. An apparatus for suppressing carrier feedthrough in a quadrature transceiver, the apparatus comprising:

a first pair of summers;

a quadrature modulator and an upconverter circuit coupled to the first pair of summers, each of the first pair of summers being operable to add one of the outputs of the quadrature modulator to one of a pair of transmitter path correction signals;

a multiplexer coupled to the upconverter circuit, to a ground, and to an RF front end;

a downconverter circuit coupled to the multiplexer;

a second pair of summers coupled to the downconverter circuit, each of the second pair of summers being operable to add one of the outputs of the downconverter to one of a pair of receiver path correction signals; and a correction circuit coupled to the first and second pairs of summers, the correction circuit performing a first correction method to determine the pair of receiver path correction signals, and performing a second correction method to determine the pair of transmitter path correction signals, and using the pairs of receiver path and transmitter path correction signals to suppress carrier feedthrough in the quadrature transceiver, the correction circuit comprising, a pair of averaging circuits coupled to the second pair of summers, a pair of absolute value circuits coupled to the pair of averaging circuits, a summer coupled to the pair of absolute value circuits; and a search circuit coupled to the summer.

2. The apparatus of claim 1, the search circuit comprising a binary search circuit.

3. The apparatus of claim 1, further comprising a feedback DC calibration circuit coupled to the pair of averaging circuits.

* * * * *